(12) United States Patent
Tanzawa

(10) Patent No.: US 11,201,165 B2
(45) Date of Patent: *Dec. 14, 2021

(54) MEMORY HAVING MEMORY CELL STRING AND COUPLING COMPONENTS

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 8 days.

This patent is subject to a terminal disclaimer.

(21) Appl. No.: 16/564,967

(22) Filed: Sep. 9, 2019

(65) Prior Publication Data

US 2020/0007896 A1    Jan. 2, 2020

Related U.S. Application Data

(63) Continuation of application No. 16/197,174, filed on Nov. 20, 2018, now Pat. No. 10,484,718, which is a
(Continued)

(51) Int. Cl.
| | |
|---|---|
| H01L 27/11582 | (2017.01) |
| H01L 27/11556 | (2017.01) |
| H01L 23/528 | (2006.01) |
| H01L 27/11524 | (2017.01) |
| H01L 27/1157 | (2017.01) |

(Continued)

(52) U.S. Cl.
CPC ........ *H01L 27/11582* (2013.01); *G11C 16/08* (2013.01); *G11C 16/10* (2013.01); *H01L 23/528* (2013.01); *H01L 27/1157* (2013.01); *H01L 27/11524* (2013.01); *H01L 27/11556* (2013.01); *G11C 5/063* (2013.01); *H01L 2924/0002* (2013.01); *H04N 19/117* (2014.11); *H04N 19/14* (2014.11); *H04N 19/176* (2014.11); *H04N 19/182* (2014.11); *H04N 19/61* (2014.11);
(Continued)

(58) Field of Classification Search
CPC ......... H01L 27/11524; H01L 27/11551; H01L 27/11553; H01L 27/11556; H01L 27/11563; H01L 27/1157; H01L 27/11578; H01L 27/1158; H01L 27/11582

See application file for complete search history.

(56) References Cited

U.S. PATENT DOCUMENTS

| | | |
|---|---|---|
| 6,411,548 B1 | 6/2002 | Sakui et al. |
| 7,352,625 B2 | 4/2008 | Futatsuyama et al. |

(Continued)

OTHER PUBLICATIONS

U.S. Appl. No. 13/436,625, now U.S. Pat. No. 9,111,620, filed Mar. 30, 2012, Memory Having Memory Cell String and Coupling Components.

(Continued)

*Primary Examiner* — Allison Bernstein
(74) *Attorney, Agent, or Firm* — Schwegman Lundberg & Woessner, P.A.

(57) ABSTRACT

Some embodiments include apparatuses and methods having a conductive line, a memory cell string including memory cells located in different levels the apparatus, and a select circuit including a select transistor and a coupling component coupled between the conductive line and the memory cell string. Other embodiments including additional apparatuses and methods are described.

14 Claims, 7 Drawing Sheets

Related U.S. Application Data continuation of application No. 15/693,229, filed on Aug. 31, 2017, now Pat. No. 10,163,928, which is a continuation of application No. 14/828,185, filed on Aug. 17, 2015, now Pat. No. 9,780,110, which is a continuation of application No. 13/436,625, filed on Mar. 30, 2012, now Pat. No. 9,111,620.

(51) Int. Cl.
  *G11C 16/08* (2006.01)
  *G11C 16/10* (2006.01)
  *G11C 5/06* (2006.01)
  *H04N 19/117* (2014.01)
  *H04N 19/14* (2014.01)
  *H04N 19/176* (2014.01)
  *H04N 19/182* (2014.01)
  *H04N 19/61* (2014.01)
  *H04N 19/80* (2014.01)
  *H04N 19/82* (2014.01)
  *H04N 19/86* (2014.01)

(52) U.S. Cl.
  CPC .............. *H04N 19/80* (2014.11); *H04N 19/82* (2014.11); *H04N 19/86* (2014.11); *H04N 19/865* (2014.11)

(56) References Cited

U.S. PATENT DOCUMENTS

| | | | |
|---|---|---|---|
| 7,355,888 B2 | 4/2008 | Hemink et al. | |
| 7,817,468 B2 | 10/2010 | Isobe et al. | |
| 7,907,454 B2 | 3/2011 | Park et al. | |
| 7,995,394 B2 | 8/2011 | Dong et al. | |
| 8,045,387 B2 | 10/2011 | Park | |
| 8,248,853 B2* | 8/2012 | Lee | G11C 16/3427 365/185.17 |
| 8,488,381 B2* | 7/2013 | Kim | H01L 27/11524 365/185.17 |
| 8,537,615 B2 | 9/2013 | Maeda | |
| 8,576,629 B2 | 11/2013 | Choe | |
| 8,792,282 B2 | 7/2014 | Lee | |
| 9,111,620 B2 | 8/2015 | Tanzawa | |
| 9,780,110 B2 | 10/2017 | Tanzawa et al. | |
| 10,163,928 B2 | 12/2018 | Tanzawa | |
| 2003/0147278 A1 | 8/2003 | Tanaka et al. | |
| 2006/0146608 A1 | 7/2006 | Fasoli | |
| 2008/0316811 A1 | 12/2008 | Higashitani | |
| 2009/0310405 A1 | 12/2009 | Lee et al. | |
| 2009/0310414 A1 | 12/2009 | Lee et al. | |
| 2009/0316489 A1 | 12/2009 | Han | |
| 2010/0002516 A1 | 1/2010 | Sim | |
| 2010/0118606 A1 | 5/2010 | Lee | |
| 2010/0315875 A1 | 12/2010 | Kim et al. | |
| 2011/0110153 A1 | 5/2011 | Dutta | |
| 2011/0249498 A1 | 10/2011 | Tokiwa et al. | |
| 2012/0002477 A1 | 1/2012 | Tang et al. | |
| 2013/0250689 A1 | 9/2013 | Lai et al. | |
| 2013/0258745 A1 | 10/2013 | Tanzawa | |
| 2015/0357344 A1 | 12/2015 | Tanzawa | |
| 2017/0365619 A1 | 12/2017 | Tanzawa | |
| 2019/0089990 A1 | 3/2019 | Tanzawa | |

OTHER PUBLICATIONS

U.S. Appl. No. 14/828,185, now U.S. Pat. No. 9,780,110, filed Aug. 17, 2015, Memory Having Memory Cell String and Coupling Components.

U.S. Appl. No. 15/693,229, now U.S. Pat. No. 10,163,928, filed Aug. 31, 2017, Memory Having Memory Cell String and Coupling Components.

U.S. Appl. No. 13/436,625, filed Nov. 20, 2018, Memory Having Memory Cell String and Coupling Components.

U.S. Appl. No. 13/436,625, Non Final Office Action dated Oct. 31, 2014, 28 pgs.

U.S. Appl. No. 13/436,625, Response filed Jan. 30, 2015 to Non Final Office Action dated Oct. 31, 2014, 15 pgs.

U.S. Appl. No. 13/436,625, Notice of Allowance dated Apr. 13, 2015, 9 pgs.

U.S. Appl. No. 14/828,185, Non Final Office Action dated May 19, 2016, 17 pgs.

U.S. Appl. No. 14/828,185, Response filed Aug. 19, 2016 to Non Final Office Action dated May 19, 2016, 15 pgs.

U.S. Appl. No. 14/828,185, Final Office Action dated Sep. 19, 2016, 16 pgs.

U.S. Appl. No. 14/828,185, Response filed Nov. 21, 2016 to Final Office Action dated Sep. 19, 2016, 11 pgs.

U.S. Appl. No. 14/828,185, Advisory Action dated Dec. 8, 2016, 3 pgs.

U.S. Appl. No. 14/828,185, Examiner interview Summary dated Jan. 25, 2017, 3 pgs.

U.S. Appl. No. 14/828,185, Non Final Office Action dated Feb. 24, 2017, 9 pgs.

U.S. Appl. No. 14/828,185, Response filed May 19, 2017 to Non Final Office Action dated Feb. 24, 2017, 9 pgs.

U.S. Appl. No. 14/828,185, Notice of Allowance dated Jun. 13, 2017, 5 pgs.

U.S. Appl. No. 15/693,229, Preliminary Amendment filed Nov. 1, 2017, 7 pgs.

U.S. Appl. No. 15/693,229, Non Final Office Action dated Dec. 15, 2017, 15 pgs.

U.S. Appl. No. 15/693,229, Response filed Apr. 16, 2018 to Non Final Office Action dated Dec. 15, 2017, 10 pgs.

U.S. Appl. No. 15/693,229, Final Office Action dated Jun. 5, 2018, 10 pgs.

U.S. Appl. No. 15/693,229, Response filed Jul. 31, 2018 to Final Office Action dated Jun. 5, 2018, 8 pgs.

U.S. Appl. No. 15/693,229, Notice of Allowance dated Aug. 24, 2018, 5 pgs.

U.S. Appl. No. 16/197,174, Notice of Allowance dated Apr. 22, 2019, 9 pgs.

* cited by examiner

US 11,201,165 B2

MEMORY HAVING MEMORY CELL STRING AND COUPLING COMPONENTS

PRIORITY APPLICATION

This application is a continuation of U.S. application Ser. No. 16/197,174, filed Nov. 20, 2018, which is a continuation of U.S. application Ser. No. 15/639,229, filed Aug. 31, 2017, now issued as U.S. Pat. No. 10,163,928, which is a continuation of U.S. application Ser. No. 14/828,185, filed Aug. 17, 2015, now issued as U.S. Pat. No. 9,780,110, which is a continuation of U.S. application Ser. No. 13/436,625, filed Mar. 30, 2012, now issued as U.S. Pat. No. 9,111,620, all of which are incorporated herein by reference in their entirety.

BACKGROUND

Memory devices, such as flash memory, are widely used in computers and many electronic products. Such memory devices have numerous memory cells. Information can be stored in the memory cells in a write operation. The stored information can be retrieved in a read operation or can be cleared in an erase operation. As memory cell density increases for a given device area, controlling these operations may pose a challenge.

DETAILED DESCRIPTION

Figure 1:
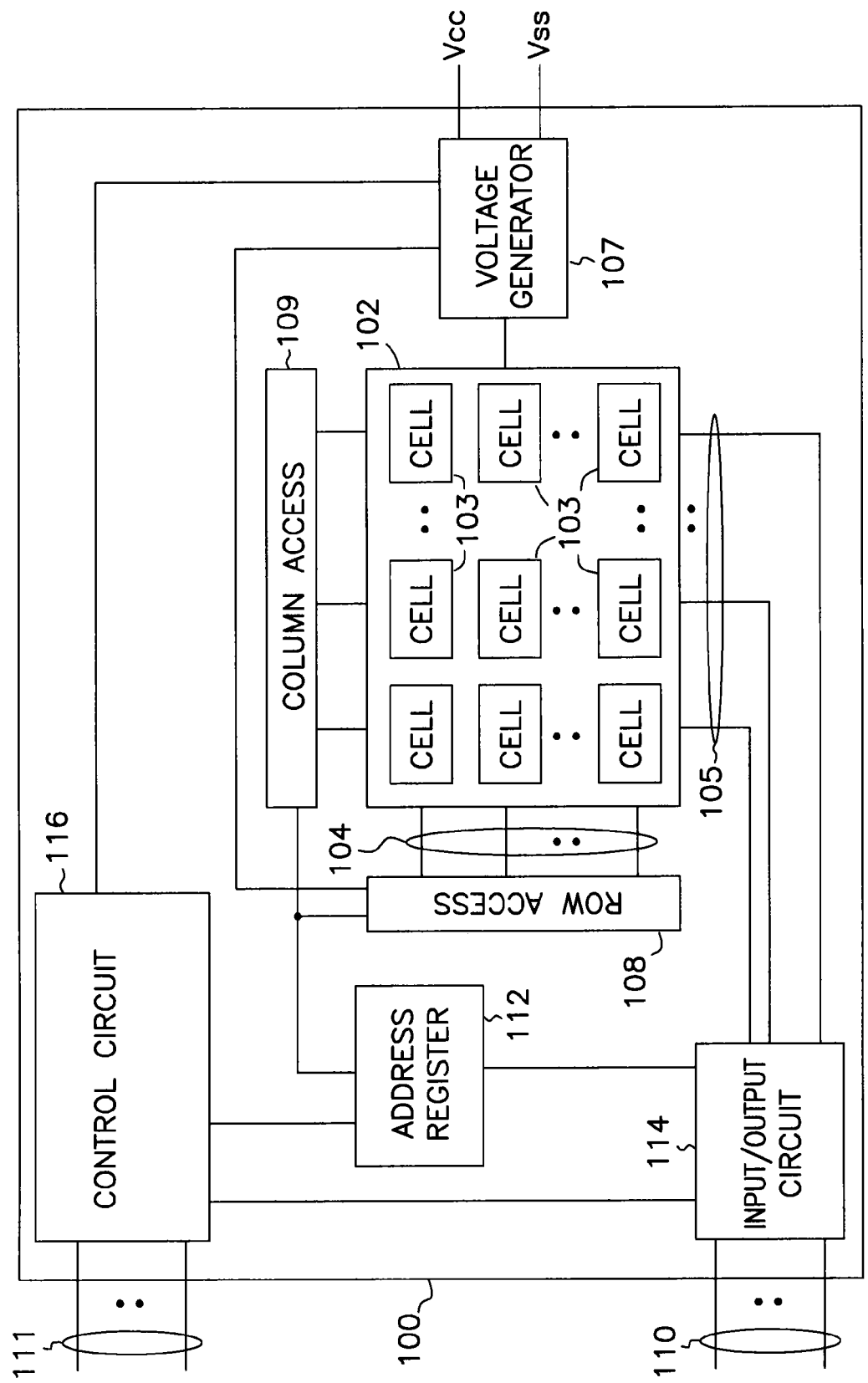
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device a processor or a memory controller) external to memory device 100 can send different commands (e.g., read, write, and erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to erase information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry. Memory device 100 can include a voltage generator 107 to generate voltages for use in operations of memory device 100, such as read, write, and erase operations.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

At least a portion of memory device 100 can include structures similar to or identical to memory devices described below with reference to FIG. 2 through FIG. 3B.

Figure 2:
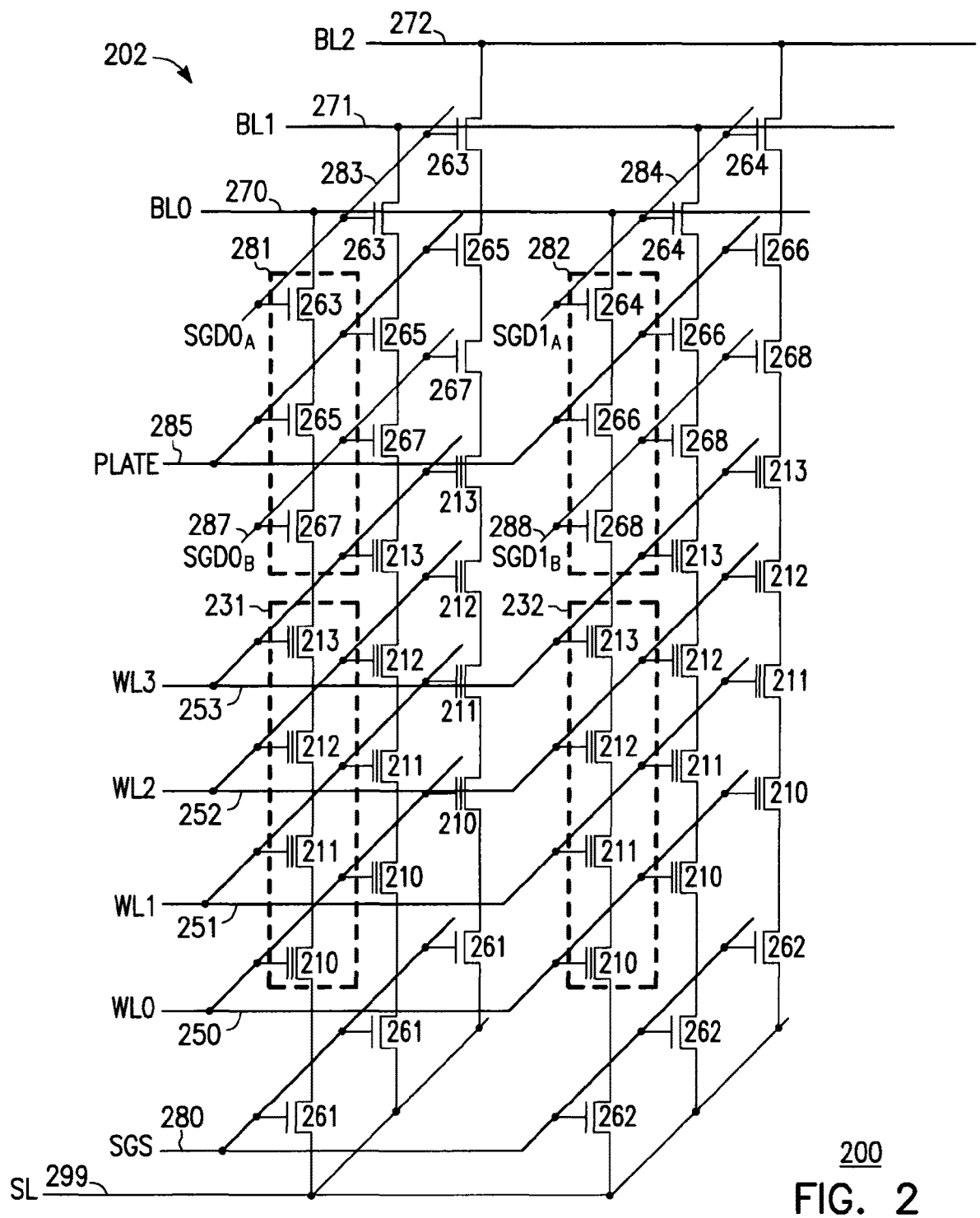
FIG. 2 shows a schematic diagram of a portion of a memory device including a memory array having select circuits, according to an embodiment of the invention.

FIG. 2 shows a schematic diagram of a portion of a memory device 200 including a memory array 202 having select circuits 281 and 282, according to an embodiment of the invention. Memory device 200 can correspond to memory device 100 of FIG. 1. For example, memory array 202 can form part of memory array 102 of FIG. 1. Memory device 200 can include a control circuit similar to or identical to control circuit 116 of FIG. 1 to control operations (e.g., read, write, and erase operations) of memory device 200.

As shown in FIG. 2, memory device 200 can include control gates 250, 251, 252, and 253 that can carry corresponding signals WL0, WL1, WL2, and WL3. Each of control gates 250, 251, 252, and 253 can form part of a respective access line of memory device 200. Memory device 200 can include lines 270, 271, and 272 that carry signals BL0, BL1, and BL2, respectively, and line 299 that can carry a signal, such as signal SL (e.g., source line signal). FIG. 2 shows four control gates 250, 251, 252, and 253 and three lines 270, 271, and 272 as an example. The number of such control gates and lines can vary. Each of lines 270, 271, and 272 can be structured as a conductive line and can form part of a respective data line of memory device 200. Line 299 can be structured as a conductive line and can form part of a source (e.g., a source line) of memory device 200.

Memory device 200 can include memory cells 210, 211, 212, and 213 arranged in memory cell strings, such as memory cell strings 231 and 232. For simplicity, in FIG. 2, only two of the memory cell strings are labeled (231 and 232). FIG. 2 shows an example of six memory cell strings and four memory cells 210, 211, 212, and 213 in each memory cell string. The number of such memory cell strings and number of such memory cells in each memory cell string can vary.

Memory device 200 can include transistors (e.g., source select transistors) 261 and 262, and each can be coupled between line 299 and an associated memory cell string (e.g., memory cell string 231 or 232). Transistors 261 and 262 can share the same gate 280. Gate 280 can form part of a select line (e.g., source select line) of memory device 200. Transistors 261 and 262 can be controlled (e.g., turned on or turned off) by the same signal, such as an SGS signal (e.g., source select gate signal) associated with gate 280. During a memory operation, such as a read or write operation, transistors 261 and 262 and can be turned on (e.g., by activating an SGS signal) to couple the memory cell strings of memory device 200 to line 299. Transistors 261 and 262 can be turned off (e.g., by deactivating the SGS signal) to decouple the memory cell strings of memory device 200 from line 299.

Select circuit 281 can be coupled between memory cell string 231 and line 270. Select circuit 282 can be coupled between memory cell string 232 and line 270. During a memory operation (e.g., a read or write operation) select circuits 281 and 282 can selectively couple memory cell strings 231 and 232 to line 270. For simplicity, in FIG. 2, only two of select circuits are labeled (281 and 282). The number of select circuits can vary. For example, the number of select circuits can be the same as the number of memory cell strings of memory device 200.

Select circuit 281 can include transistors (e.g., drain select transistors) 263 and 267 and a coupling component 265 coupled in series among each other between line 270 and memory cell string 231. Select circuit 282 can include transistors (e.g., drain select transistors) 264 and 268 and a coupling component 266 coupled in series among each other between line 270 and memory cell string 232. Coupling components 265 and 266 can share the same control line 285, which can be controlled by the same signal, such as signal PLATE.

Each of coupling components 265 and 266 can turn on to operate as a transistor (e.g., similar to select transistor 263, 264, 267, or 268) or to operate as a storage element to hold a charge in its body. For example, coupling component 265 can turn on to operate as a transistor if one of memory cells 210, 211, 212, and 213 of memory cell string 231 is selected to store information in a write operation. Coupling component 265 can turn on to operate as a storage element to hold a charge in its body if no memory cells of memory cell string 231 are selected to store information in a write operation. In another example, coupling component 266 can turn on to operate as a transistor if one of memory cells 210, 211, 212, and 213 of memory cell string 232 is selected to store information in a write operation. Coupling component 266 can turn on to operate as a storage element to hold a charge in its body if no memory cells of memory cell string 232 are selected to store information in a write operation.

As shown in FIG. 2, transistors 263 can share the same gate (e.g., drain select gate) 283. Transistors 267 can share the same gate (e.g., drain select gate) 287. Each of gates 283 and 287 can form part of a respective select line (e.g., drain select line) of memory device 200. Transistors 263 and 267 and can be controlled (e.g., turned on or turned off) by corresponding $SGD0_A$ and $SGD0_B$ (e.g., drain select gate signals). During a memory operation (e.g., read or write operation) of memory device 200, signals $SGD0_A$ and $SGD0_B$ can be provided (e.g., biased) with the same voltages. Thus, gates 283 and 287 can be physically coupled to each other, such that signals $SGD0_A$ and $SGD0_B$ can be provided by the same signal.

Transistors 264 can share the same gate (e.g., drain select gate) 284. Transistors 268 can share the same gate (e.g., drain select gate) 288. Each of gates 284 and 288 can form part of a respective select line (e.g., drain select line) of memory device 200. Transistors 264 and 268 and can be controlled (e.g., turned on or turned off) by corresponding $SGD1_A$ and $SGD1_B$ (e.g., drain select gate signals). During a memory operation (e.g., read or write operation) of memory device 200, signals $SGD1_A$ and $SGD1_B$ can be provided with the same voltages. Thus, gates 284 and 288 can be physically coupled to each other, such that signals $SGD1_A$ and $SGD1_B$ can be provided by the same signal.

Memory cells 210, 211, 212, and 213 in each of memory cell string can be physically located in multiple levels of memory device 200, such that memory cells 210, 211, 212, and 213 in the same memory cell string can be stacked over each other in multiple levels of memory device 200.

Figure 3:
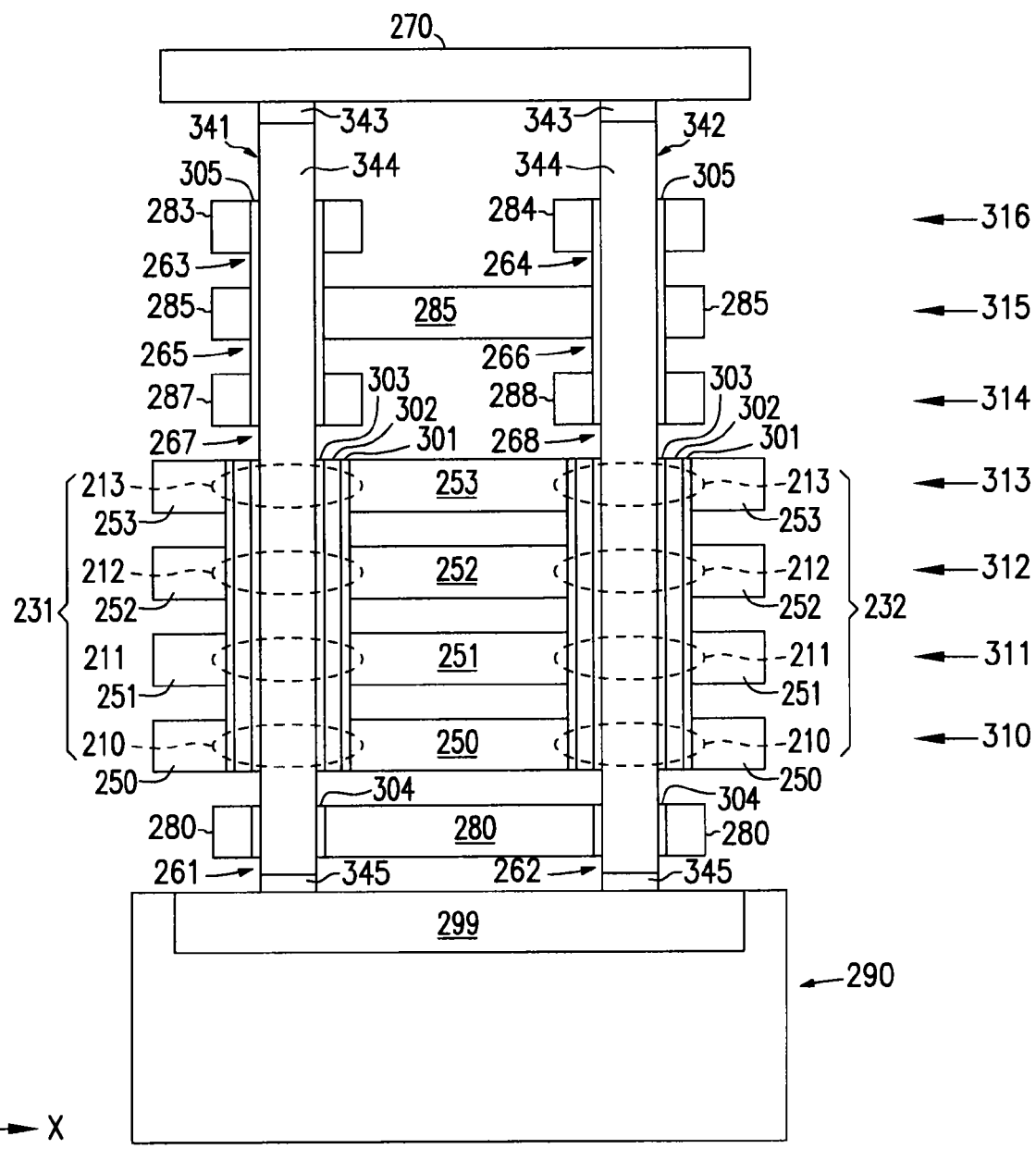
FIG. 3 shows a side view of a structure of a portion of the memory device of FIG. 2, according to an embodiment of the invention.

FIG. 3 shows a side view of a structure of a portion of memory, device 200 of FIG. 2, according to an embodiment of the invention. As shown in FIG. 3, memory device 200 can include a substrate 290 where memory cell string 231 can be formed over substrate 290. Substrate 290 can include a monocrystalline (also referred to as single-crystal) semiconductor material. For example, substrate 290 can include monocrystalline silicon (also referred to as single-crystal silicon). The monocrystalline semiconductor material of substrate 290 can include impurities, such that substrate 290 can have a specific conductivity type (e.g., n-type or p-type).

Memory device 200 can include pillars 341 and 342 extending outwardly from substrate 290 in a z-direction of memory device 200. The z-direction can extend in a direction associated with the thickness of substrate 290. FIG. 3 also shows an x-direction, which is perpendicular to the z-direction. Each of pillars 341 and 342 can include a material that is capable of providing a conduction of current between lines 270 and 299.

Each of pillars 341 and 342 can include a portion 343 coupled to line 270, a portion 345 coupled to line 299, and a portion 344 between portions 343 and 345. Portions 343 and 345 can include materials of the same conductivity type. Portion 344 can include a material having a different conductivity type from that of portions 343 and 345. For example, portions 343 and 345 can include a semiconductor material of n-type (e.g., n-type polycrystalline silicon), and portion 344 can include a semiconductor material of p-type (e.g., p-type polycrystalline silicon). Alternatively, portions 343, 344, and 345 can include materials of the same conductivity type (e.g., n-type polycrystalline silicon).

As shown in FIG. 3, memory device 200 can include different levels 310 through 316 with respect to the z-direction. Pillar 341 can be associated with memory cell string 231, such that memory cells 210, 211, 212, and 213 of memory cell string 231 can be located in levels 310, 311, 312, and 313, respectively, along a portion of pillar 341 (e.g., along a portion of pillar 341 that extends from level 310 to level 313).

Pillar 342 can be associated with memory cell string 232, such that memory cells 210, 211, 212, and 213 of memory cell string 232 can be located in levels 310, 311, 312, and 313, respectively, in the z-direction along a portion of pillar 342 along a portion of pillar 342 that extends from level 310 to level 313).

Control gates 250, 251, 252, and 253 associated with respective memory cells 210, 211, 212, and 213 can also be located in levels 310, 311, 312, and 313, respectively, along a portion of each of pillars 341 and 342 that extends from level 310 to level 313. The materials of control gates 250, 251, 252, and 253 can include a conductive material (e.g., conductively doped polycrystalline silicon or other conductive material).

Transistor 267, coupling component 265, and transistor 263 can be located in levels 314, 315, and 316, respectively, along a portion of pillar 341 (e.g., along a portion of pillar 341 that extends from level 314 to level 316).

Transistor 268, coupling component 266, and transistor 264 can be located in levels 314, 315, and 316, respectively, along a portion of pillar 342 (e.g., along a portion of pillar 342 that extends from level 314 to level 316).

Gate 287, control line 285, and gate 283 (associated with transistor 267, coupling components 265 and 266, and transistor 263, respectively) can be located in levels 314, 315, and 316, respectively, along a portion of pillar 341 (e.g., along a portion of pillar 341 that extends from level 314 to level 316).

Gate 288 and gate 284 can be located in level 314 and 316, respectively, along a portion of pillar 342 (e.g., along a portion of pillar 342 that extends from level 314 to level 316).

Each of memory cell strings 231 and 232 can include materials 301, 302, and 303 between each of control gates 250, 251, 252, and 253 and a respective pillar 341 or 342.

Material 301 can include a charge blocking material(s) (e.g., a dielectric material such as silicon nitride) that is capable of blocking a tunnel of a charge.

Material 302 can include a charge storage material(s) that can provide a charge storage function to represent a value of information stored in memory cell 210, 211, 212, or 213. For example, material 302 can include a charge trapping material (e.g., SiN) that can be configured to trap charges. In another example, material 302 can include conductively doped polycrystalline silicon, which can be either a p-type polycrystalline silicon or an n-type polycrystalline silicon. The polycrystalline silicon can be configured to operate as a floating gate (e.g., to store charge) in a memory cell (e.g., a memory cell 210, 211, 212, or 213).

Material 303 can include a tunnel dielectric material(s) (e.g., an oxide of silicon) that is capable of allowing tunneling of a charge (e.g., electrons).

FIG. 3 shows an example where materials 301, 302, and 303 can be formed continuously in memory cells 210, 211, 212, and 213 (e.g., along the sidewalls of a portion of each of pillars 341 and 342). Alternatively, materials 301, 302, and 303 in one memory cell can be separated (e.g., by dielectrics in the z-direction) from materials 301, 302, and 303 of each of the other memory cells.

Memory device 200 can include material (e.g., dielectric) 305 between a respective pillar 341 or 342 and each of select gates 283 and 284, control line 285, and select gates 287 and 288. Memory device 200 can include material (e.g., dielectric) 304 between pillar 341 and gate 280 and between pillar 342 and gate 280. Materials 304 and 305 can be the same as material 303 (e.g., an oxide of silicon). Material 305 can be formed in the same processing step (e.g., by depositing material 305 at the same time on sidewalls of portions of pillars 341 and 342 that extend between level 314 and 316).

Line 299 can be located over (e.g., formed in or formed on) a portion of substrate 290. FIG. 3 shows an example where line 299 can be formed in substrate. Line 299, however, can be formed over (e.g., by depositing a conductive material) a portion of substrate 290.

Figure 4:
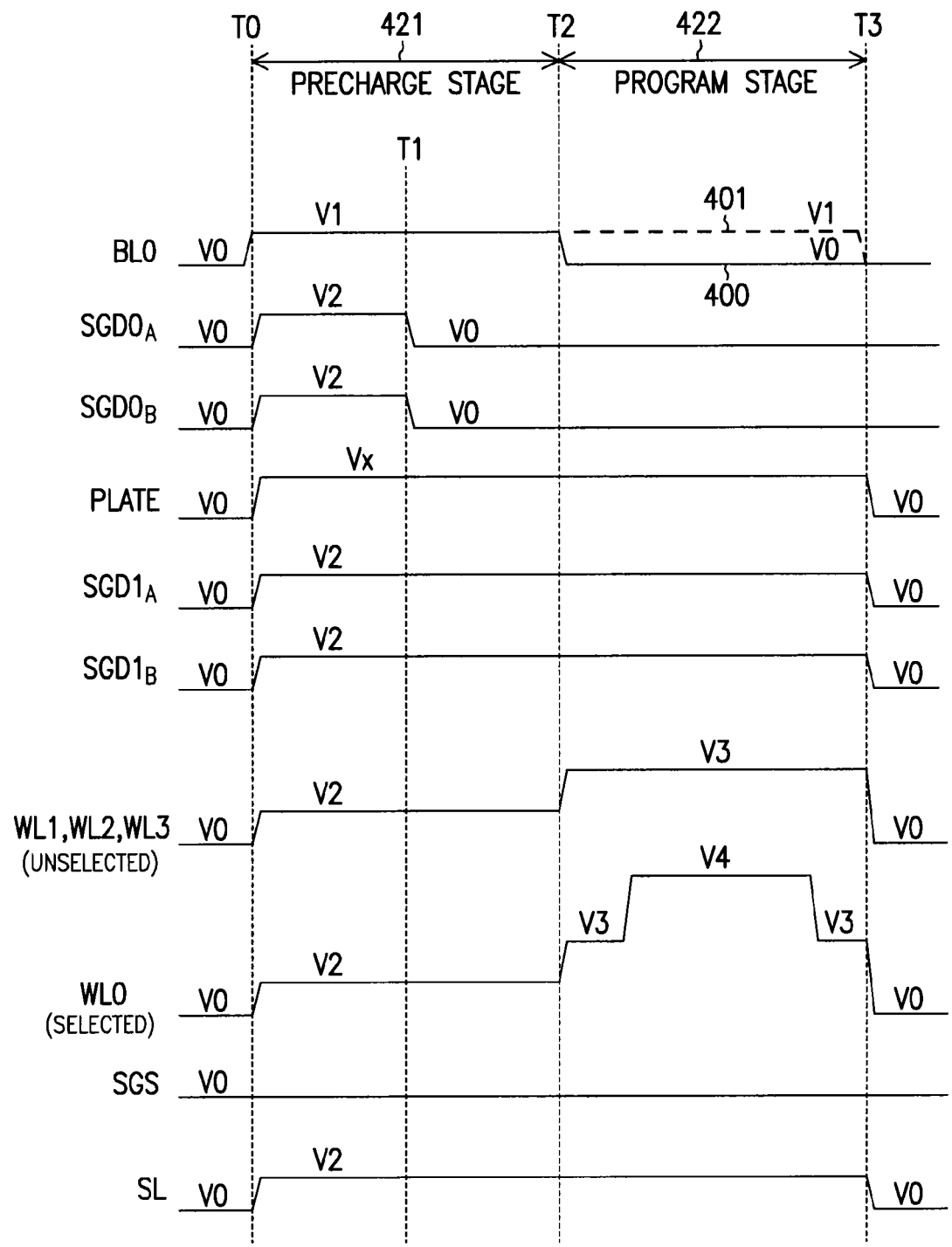
FIG. 4 is a timing diagram for some signals of the memory device of FIG. 2 and FIG. 3, according to an embodiment of the invention.

FIG. 4 is a timing diagram for some signals of memory device 200 of FIG. 2 and FIG. 3, according to an embodiment of the invention. The timing diagram of FIG. 4 can be associated with a write operation of memory device 200 where at least one of memory cells 210, 211, 212, and 213 of a memory cell string (e.g., 231 or 232) of memory device 200 is selected to store information in the write operation.

In the following example write operation of memory device 200, memory cell 210 of memory cell string 232 is assumed to be a selected memory cell to store information. Thus, memory cell string 232 (which includes a selected memory cell in the example write operation) can be a selected memory cell string in the example write operation. Memory cell string 231 can be an unselected memory cell string, such that no memory cells of memory cell string 231 are selected to store information in the example write operation. The following description refers to FIG. 2, FIG. 3, and FIG. 4.

As shown in FIG. 4, a write operation of memory device 200 can include time intervals 421 and 422. Time interval 412 can occur during a stage (e.g., precharge stage) of a write operation. Time interval 421 can occur during another stage (e.g., program stage) of the write operation. Information can be stored in a selected memory cell (e.g., memory cell 210 of memory cell string 232 in this example) during time interval 422.

T0, T1, T2, and T3 in FIG. 4 represent different times. V0, V1, V2, V3, V4, and Vx represent different voltages that can be provided to signals of memory device 200. Voltage V0 can have a value corresponding to ground potential (e.g., zero volts (V)). Voltages V1, V2, V3, V4, and Vx can have positive values. For example, voltage (e.g., data line inhibit voltage) V1 can have a value of approximately 2V. Voltage V2 can have a value (e.g., 2V) equal to that of voltage V1. Voltage (e.g., program inhibit voltage) V3 can have a value of approximately 8V. Voltage memory cell programming voltage) V4 can have a value of approximately 18V. Voltage Vx can have a value of approximately 2V or greater (e.g., between 2V and 4V, or other values greater than two volts).

Other values for voltages V0, V1, V2, V3, V4, and Vx can be used. The waveforms of the signals in FIG. 4 are not scaled.

During time interval 421, signal BL0 (applied to line 270 of FIG. 2 and FIG. 3) can be provided with voltage V1. During time interval 422, signal BL0 can be provided with either voltage V0 or voltage V1. For example, if information having a value corresponding to a state 400 is to be stored in memory cell 210 of memory cell string 232, then signal BL0 can be provided with voltage V0 during time interval 422. If information having a value corresponding to a state 401 is to be stored in memory cell 210 of memory cell string 232, then signal BL0 can be provided with voltage V1 during time interval 422. FIG. 4 shows that one out of two voltages (e.g., V1 and V0) can be provided to signal BL0 during time interval 422 to indicate an example where each of memory cells 210, 211, 212, and 213 can be a single level cell. More than two voltages can be used. For example, if each of memory cells 210, 211, 212, and 213 of memory device 200 (FIG. 2) is configured as multi-level cell (e.g., more than one bit per cell), then one out of more than two voltages can be selected and provided to signal BL0 during time interval 422, depending on which state is to be stored in the selected memory cell.

During a portion of time interval 421 (e.g., between times T0 and T1), memory device 200 can provide voltage V2 to signal $SGD0_A$ and $SGD0_B$ to turn on transistors 263 and 267. Voltage V1 from line 270 (associated with signal BL0) can be passed from line 270 to coupling component 265 between times T0 and T1.

Memory device 200 can provide voltage Vx to signal PLATE during time intervals 421 and 422 to turn on coupling component 265 during time intervals 421 and 422.

At time T1, memory device 200 can provide a voltage V0 to signal $SGD0_A$ and $SGD0_B$ to turn off transistors 263 and 267.

Memory device 200 can provide a voltage V2 to signals WL1, WL2, and WL3 associated with lines 251, 252, and 253 (e.g., unselected lines) during time interval 421 and voltage V3 to signals WL1, WL2, and WL3 during time interval 422. Voltage V3 provided to signals WL1, WL2, and WL3 can locally boost the potential (e.g., boost to voltage V3) at portions of pillars 341 and 342 (e.g., portions of pillars 341 and 342 between levels 311 and 313) where unselected memory cells (e.g., 211, 212, and 213) of memory cell strings 231 and 232 are located. The boosted potential can prevent unselected memory cells from being inadvertently programmed.

When transistors 263 and 267 turn off during a portion of time interval 421 (e.g., between times T1 and T2) and during time interval 422, coupling component 265 (which is turned on by voltage Vx being provided to signal PLATE) can operate as a storage element to hold a charge in its body at a portion of pillar 341 surrounded by control line 285. This can cause the potential at the portion of pillar 341 surrounded by control line 285 (e.g., a body of coupling component 265) to be greater than the potential at a portion of pillar 341 surrounded by line 287 (e.g., a body of transistor 267). This potential difference can cause a reverse bias condition at a junction between these two portions of pillar 341 (e.g., the portion of pillar 341 surrounded by control line 285 and the portion of pillar 341 surrounded by line 287). The reverse bias condition may reduce or prevent a leakage path from pillar 341 to line 270 if line 270 is provided with a voltage, such as voltage V0, during time interval 422. Reducing the leakage path may prevent memory cells in unselected memory cell string (e.g., memory cell string 231 in this example) from being inadvertently programmed.

During time intervals 421 and 422, memory device 200 can provide voltage V2 to signals $SGD1_A$ and $SGD1_B$ to turn on transistors 264 and 268. Coupling component 266 can also be turned on during time intervals 421 and 422 by voltage Vx provided to signal PLATE during time intervals 421 and 422. When transistors 264 and 268 turn on, coupling component 266 (which is turned on) can operate as a transistor to form part of a conductive path (e.g., formed by transistors 264 and 268 and coupling component 266) between line 270 and pillar 342 during time intervals 421 and 422.

Memory device 200 can provide a voltage V2 to signal WL0 associated with line 250 (e.g., a selected line) during time interval 421 and voltage V4 to signal WL0 during at least a portion of time interval 422 to store information in memory cell 210 (selected memory cell) of memory cell string 232, in this example. As shown in FIG. 4, signal WL0 can also be provided with voltage V3 at different times within time interval 422, such as before and after voltage V4 is provided to signal WL0 during time interval 422.

Memory device 200 can provide voltage V0 to signal SGS to turn off transistors 261 and 262 during time intervals 421 and 422. Memory device 200 can provide voltage V2 to signal SL, which is associated with line 299 (FIG. 2).

The example write operation described above assumes that memory cell string 232 is a selected memory cell string where one of memory cells 210, 211, 212, and 213 (e.g., memory cell 210) is selected to store information. If memory cell string 232 is an unselected memory cell string in a write operation (e.g., if no memory cells of the memory string 232 are selected to store information in a write operation), and if memory cell string 231 is a selected memory cell string (e.g., if one of memory cells 210, 211, 212, and 213 of memory cell string 231 is selected to store information), then the waveforms of signals $SGD0_A$ and $SGD1_A$ can be exchanged with each other, and waveforms of signals $SGD0_B$ and $SGD1_B$ can be exchanged with each other. Thus, in this case, during time intervals 421 and 422, transistors 264 and 268 can operate to turn on or turn off in fashions similar to those of transistors 263 and 267, respectively, described above. For example, if no memory cells 210, 211, 212, and 213 of memory cell string 232 are selected to store information in a write operation, then memory device 200 can turn on transistors 264 and 266 during at least a portion (e.g., between times T0 and T1) of time interval 421 and turn off transistors 264 and 266 during time interval 422.

In a read operation, memory device 200 can turn on transistors 261 and 262 and coupling components 265 and 266. In a read operation, memory device 200 can turn on transistors 263 and 267 if one of memory cells 210, 211, 212, and 213 of memory cell string 231 is selected to retrieve information from it. Memory device 200 can turn off transistors 263 and 267 if no memory cells of memory cell string 231 are selected to retrieve information from it. Similarly, in a read operation, memory device 200 can turn on transistors 264 and 268 if one of memory cells 210, 211, 212, and 213 of memory cell string 232 is selected to retrieve information from it. Memory device 200 can turn off transistors 264 and 268 if no memory cells of memory cell string 232 are selected to retrieve information from it.

Figure 5:
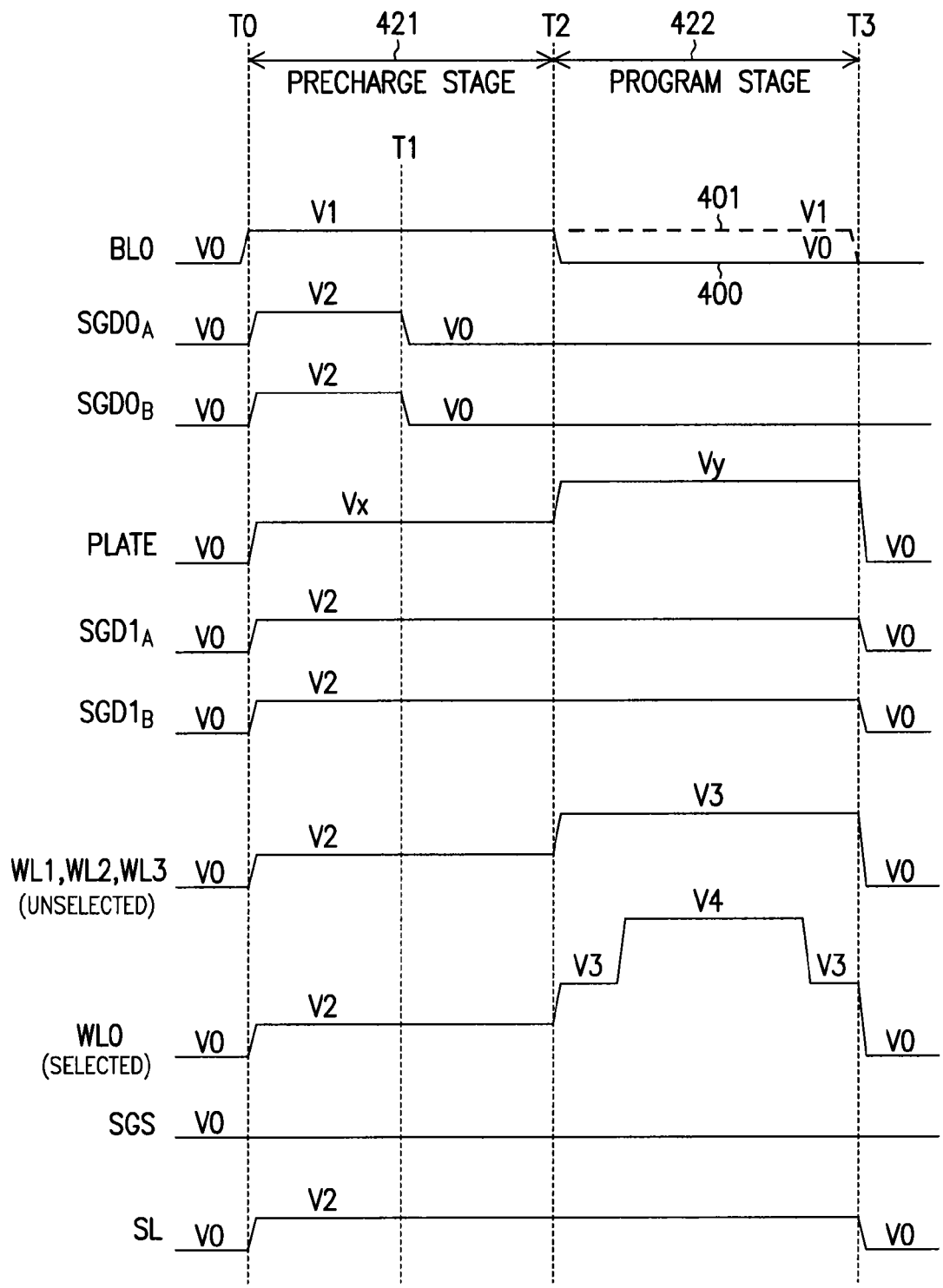
FIG. 5 is an alternative timing diagram for some signals of the memory device of FIG. 2 and FIG. 3, according to an embodiment of the invention.

FIG. 5 is an alternative timing diagram for some signals of the memory device of FIG. 2 and FIG. 3, according to an embodiment of the invention. The same signals in FIG. 4 and FIG. 5 can be provided with the same voltages except for signal PLATE. As shown in FIG. 5, signal PLATE can be provided with voltage Vx during time interval 421 and a voltage Vy during time interval 422. Voltage Vy can have a value greater than that of voltage Vx. Providing a voltage (e.g., Vy) with a greater value to signal PLATE during time interval 422 than during time interval 421 may allow a greater program inhibit voltage (e.g., voltage V3) to be used during a write operation.

Providing voltages Vx or a combination of voltages Vx and Vy to signal PLATE, as described above with reference to FIG. 4 and FIG. 5, may allow a portion of a pillar (e.g., pillar 341) associated with an unselected memory cell string to be boosted to potential (e.g., program inhibit voltage) as high as possible during the write operation (e.g., during at least time interval 422). This higher program inhibition capability may increase the number of possible inhibit memory cells (e.g., in unselected memory cell strings) along the pillar. Thus, more memory cells may be stacked in more levels (e.g., in the z-direction) of memory device 200. Therefore, memory cell density in memory device 200 can be increased for a given device area.

Figure 6:
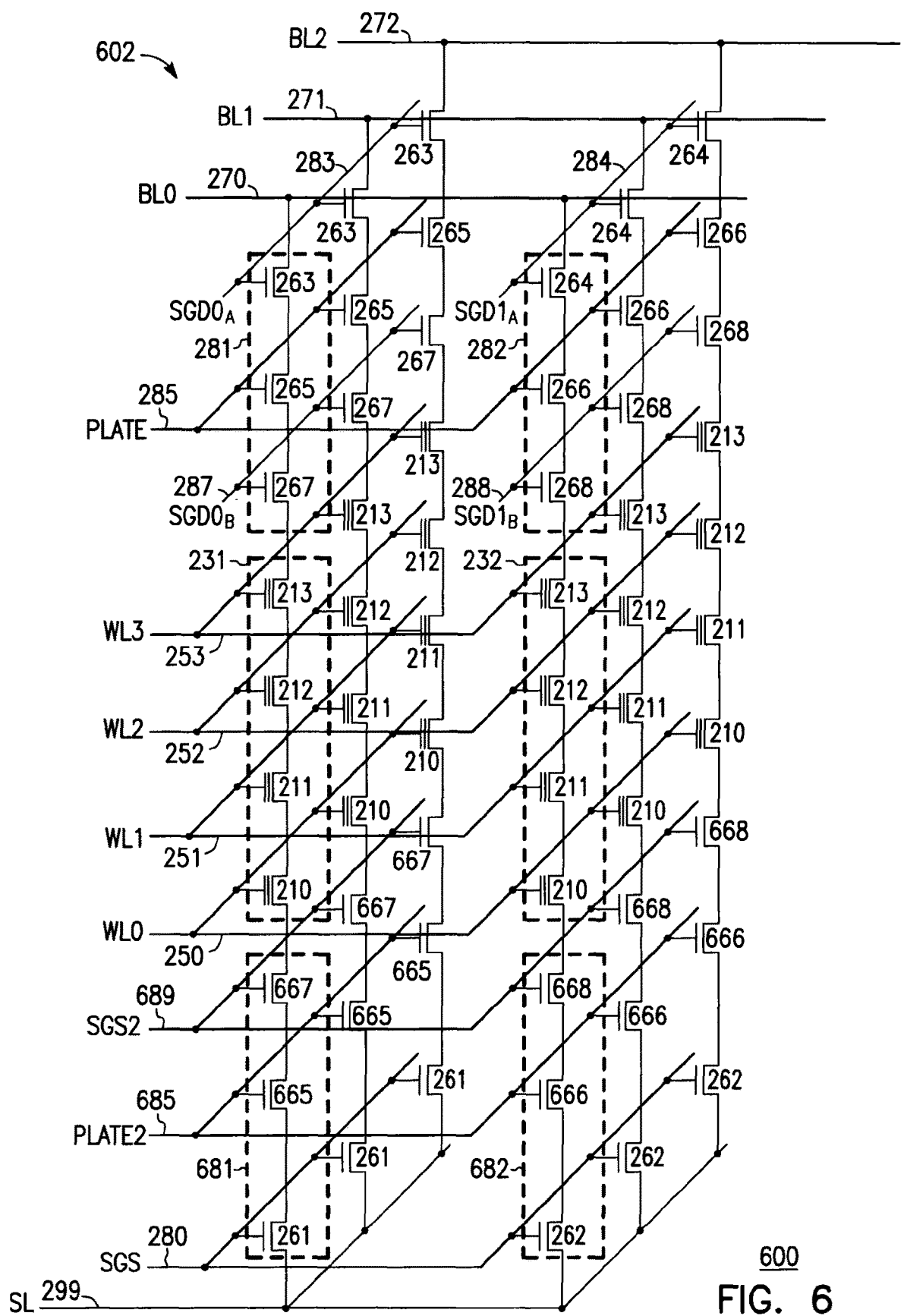
FIG. 6 shows a schematic diagram of a portion of a memory device including a memory array having top and bottom select circuits, according to an embodiment of the invention.

FIG. 6 shows a schematic diagram of a portion of a memory device 600 including a memory array 602 having select circuits (e.g., top select circuits) 281 and 282 and select circuits (e.g., bottom circuit) 681 and 682, according to an embodiment of the invention. Memory device 600 can include features similar to or identical to those of memory device 200. Thus, the descriptions of similar or identical features between FIG. 2 and FIG. 6 are not repeated in the description of FIG. 6. For example, select circuits 281 and 282 and control line 285 in FIG. 6 can be the same as those in FIG. 2. Some of the differences between FIG. 2 and FIG. 6 include select circuits 681 and 682 and control line 685 in FIG. 6.

As shown in FIG. 6, select circuit 681 can include transistors (e.g., select transistors) 261 and 667 and a coupling component 665 coupled in series among each other between line 299 and memory cell string 231. Select circuit 681 can be coupled in series with memory cell string 231 and select circuit 281 between lines 270 and 299.

Select circuit 682 can include transistors select transistors) 262 and 668 and a coupling component 666 coupled in series among each other between line 299 and memory cell string 232. As shown in FIG. 6, select circuit 682 can be coupled in series with memory cell string 232 and select circuit 282 between lines 270 and 299.

Transistors 667 and 668 can share the same gate 689. Gate 689 can form part of a select line (e.g., source select line) of memory device 600. Transistors 667 and 668 can be controlled (e.g., turned on or turned off) by the same signal, such as an SGS2 signal (e.g., source select gate signal) associated with gate 689. Signal SGS2 can be provided with voltages similar to or identical to those of signal SGS of memory device 200 of FIG. 2.

As shown in FIG. 6, coupling components 665 and 666 can share the same control line 685, which can be controlled by the same signal, such as signal PLATE2. The operations of components 665 and 666 can be similar to identical to those of coupling components 265 and 266, respectively. For example, each of coupling components 665 and 666 can turn on to operate as a transistor or turn on to operate as a storage element to hold a charge in its body.

Figure 7:
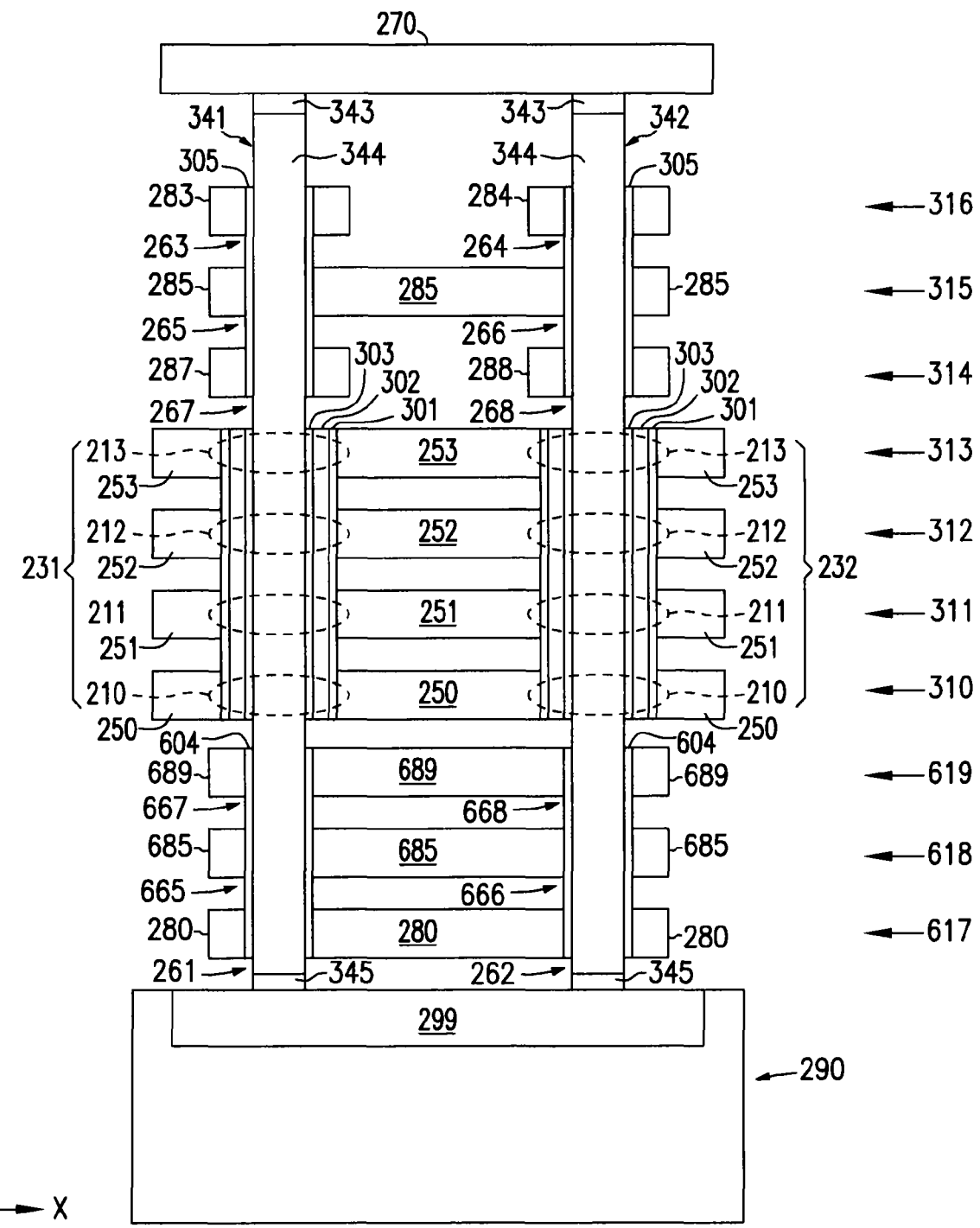
FIG. 7 shows a side view of a structure of a portion of the memory device of FIG. 6, according to an embodiment of the invention.

FIG. 7 shows a side view of a structure of a portion of the memory device of FIG. 6, according to an embodiment of the invention. The structure of memory device 600 can include features similar to or identical to those of the structure of memory device 200 shown in FIG. 3. Thus, the descriptions of similar or identical features between FIG. 3 and FIG. 7 are not repeated in the description of FIG. 7.

As shown in FIG. 7, memory device 600 can include different levels, including levels 310 through 316 and levels 617, 618, and 619 with respect to the z-direction. Transistor 261, coupling component 665, and transistor 667 can be located in levels 617, 618, and 619, respectively, along a portion of pillar 341. Transistor 262, coupling component 666, and transistor 668 can be located in levels 617, 618, and 619, respectively, along a portion of pillar 342.

Gate 280, control line 685, and gate 689 (associated with transistors 261/262, coupling components 665/666, and transistors 667/668, respectively) can be located in levels 617, 618, and 619, respectively, along respective portions of pillar 341 and 342 (e.g., along portions of pillars 341 and 342 that extend from level 617 to level 619).

Memory device 600 can include material (e.g., dielectric) 604 between respective portions of pillars 341 or 342 and each of select gates 280, control line 685, and select gate 689. Materials 604 can be the same as material 304 (e.g., an oxide of silicon) of FIG. 3. In FIG. 6, material 604 can be formed in the same processing step (e.g., by depositing material 604 at the same time on sidewalls of portions of pillars 341 and 342 that extend from level 617 to level 619.

The illustrations of apparatuses memory devices 100 and 200) and methods (e.g., operating methods associated with memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., memory devices 100 and 200) or a system (e.g., a computer, a cellular phone, or other electronic system) that includes a device such as memory devices 100 and 200.

Any of the components described above with reference to FIG. 1 through FIG. 5 can be implemented in a number of ways, including simulation via software. Thus, apparatuses (e.g., memory devices 100 and 200 or part of memory devices 100 and 200, including control circuit 116 (FIG. 1), and select circuits 281 and 282 in FIG. 2) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100 and 200 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 5 include an apparatus and methods having a conductive line, a memory cell string including memory cells located in different levels the apparatus, and a select circuit including a select transistor and a coupling component coupled between the conductive line and the memory cell string. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a memory device; and
an external device coupled to the memory device, the memory device including:
a first pillar;
first memory cells and associated control gates located in different levels of the memory device and along a first portion of the first pillar;
a first select gate, a control line, and a second select gate located in different levels of the memory device and along a second portion of the first pillar;
a second pillar, and second memory cells located in different, levels of the memory device and along a first portion of the second pillar;
third memory cells located in different levels of the memory device and located along a third pillar;
a first conductive material coupled to the first pillar and the second pillar, wherein the first select gate, the control line, and the second select gate are between the first conductive material and the first memory cells;
a second conductive material coupled to the third memory cells; and
a first coupling component located along the second portion of the first pillar, the first coupling component being between the first select gate and the second select gate;
a second coupling component located along a second portion of the second pillar; and
a third coupling component coupled to the second conductive material and the third memory cells and located between the second conductive material and the third memory cells.

2. The apparatus of claim 1, wherein the external device includes a memory controller.

3. The apparatus of claim 1, wherein the external device includes a processor.

4. The apparatus of claim 1, wherein the first conductive material is part of a first data line of the memory device, and the second conductive material is part of a second data line of the memory device.

5. The apparatus of claim 1, further comprising a third select gate located along a third portion of the first pillar, wherein the first memory cells are between the second and third select gates.

6. The apparatus of claim 1, wherein the first portion of the first pillar includes a first material, the first pillar includes a second material and a third material, the first material is between the second and third materials, the first material has a first conductivity type, and the second and third materials have a second conductivity type.

7. The apparatus of claim 6, wherein the first conductivity type includes p-type material, and the second conductivity type includes n-type material.

8. The apparatus of claim 1, further comprising a dielectric between the first pillar and each of the first select gate, the control line, and the second select gate.

9. The apparatus of claim 1, wherein the first and second select gates are coupled to each other.

10. An apparatus comprising:
a memory device; and
an external device coupled to the memory device, the memory device including:
a first pillar;
first multiple select gates located along a first portion of the first pillar, first additional multiple select gates located along a second portion of the first pillar, and first memory cells located along a third portion of the first pillar between the first and second portions of the first pillar;
a second pillar;
second multiple select gates located along a first portion of the second pillar, second additional multiple select gates located along a second portion of the second pillar, and second memory cells located along a third portion of the second pillar between the first and second portions of the second pillar;
a third pillar;
third multiple select gates located along a first portion of the third pillar, third additional multiple select gates located along a second portion of the third pillar, and third memory cells located along a third portion of the third pillar between the first and second portions of the third pillar;
a first transistor located along the first pillar and between the first multiple select gates;
a second transistor located along the second pillar and between the second multiple select gates; and
a third transistor located along the third pillar and between the third multiple select gates.

11. The apparatus of claim 10, wherein the external device includes a memory controller.

12. The apparatus of claim 10, wherein the external device includes a processor.

13. The apparatus of claim 10, wherein the first multiple select gates are coupled to each other.

14. The apparatus of claim 10, further comprising:
a first additional transistor located along the first pillar and between the first additional multiple select gates;
a second additional transistor located along the second pillar and between the second additional multiple select gates; and
a third additional transistor located along the third pillar and between the third additional multiple select gates.

* * * * *